United States Patent
Wallash et al.

(10) Patent No.: US 10,285,259 B2
(45) Date of Patent: May 7, 2019

(54) SOLENOID FILTER BUILT INTO A PRINTED CIRCUIT BOARD

(71) Applicant: Western Digital Technologies, Inc., San Jose, CA (US)

(72) Inventors: Albert Wallash, Morgan Hill, CA (US); John Contreras, Palo Alto, CA (US); Ronald G. Parkinen, Lake Forest, CA (US); Xinzhi Xing, San Jose, CA (US); Hui He, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/632,108

(22) Filed: Jun. 23, 2017

(65) Prior Publication Data
US 2018/0376583 A1    Dec. 27, 2018

(51) Int. Cl.
*H05K 1/02*    (2006.01)
*H01F 17/00*   (2006.01)
*H03H 7/01*    (2006.01)

(52) U.S. Cl.
CPC ....... *H05K 1/0233* (2013.01); *H01F 17/0013* (2013.01); *H03H 7/0115* (2013.01); *H01F 2017/002* (2013.01)

(58) Field of Classification Search
CPC ............ H01F 17/0006; H01F 17/0013; H01F 2017/002; H01F 2017/0026; H01F 2017/004; H01F 2017/0073; H01F 2017/0086; H03H 7/0115; H05K 1/023; H05K 1/0233

USPC ................. 327/551, 552, 557, 558
See application file for complete search history.

(56) References Cited

U.S. PATENT DOCUMENTS

| | | | |
|---|---|---|---|
| 5,572,180 A | * | 11/1996 | Huang ............... H01F 17/0013 336/184 |
| 5,801,597 A | | 9/1998 | Carter et al. |
| 6,091,310 A | * | 7/2000 | Utsumi ................ H01L 23/645 174/262 |

(Continued)

FOREIGN PATENT DOCUMENTS

| | | |
|---|---|---|
| JP | H02181961 A | 7/1990 |
| JP | H08293416 A | 11/1996 |

OTHER PUBLICATIONS

International Search Report and Written Opinion in PCT Application No. PCT/US2018/022519 (filed Mar. 14, 2018), dated Jul. 4, 2018.

(Continued)

*Primary Examiner* — William Hernandez (57) ABSTRACT

Disclosed herein are printed circuit boards with embedded solenoid filters through which signal traces pass to filter unwanted noise and electromagnetic interference. A printed circuit board comprises a least three layers, a solenoid embedded within the at least three layers, and at least one trace extending through the solenoid. The insertion loss characteristics of the solenoid filter can be tuned by modifying the number of turns in the solenoid(s) and the width of the solenoid(s). The solenoid filter may comprise multiple solenoids connected in series, with adjacent solenoids having opposite wind directions. Surface components may be included on the board to tune the insertion loss further.

14 Claims, 9 Drawing Sheets

(56) References Cited

U.S. PATENT DOCUMENTS

| | | | |
|---|---|---|---|
| 6,380,608 B1* | 4/2002 | Bentley | H01F 17/0013 257/3 |
| 7,130,434 B1 | 10/2006 | Grattan et al. | |
| 7,271,978 B1 | 9/2007 | Santini et al. | |
| 7,423,884 B2* | 9/2008 | Enchi | H05K 1/165 336/199 |
| 7,529,103 B2 | 5/2009 | Chen et al. | |
| 7,535,321 B1 | 5/2009 | Degerstrom et al. | |
| 7,657,564 B2 | 2/2010 | Hsu et al. | |
| 7,825,750 B2 | 11/2010 | Lee et al. | |
| 7,928,824 B2* | 4/2011 | Jow | H01F 17/0013 336/200 |
| 8,848,385 B2 | 9/2014 | Warwick et al. | |
| 9,030,287 B2 | 5/2015 | Motomiya et al. | |
| 2004/0130415 A1* | 7/2004 | Chiba | H01F 17/0013 333/185 |
| 2006/0081397 A1 | 4/2006 | Enchi et al. | |
| 2006/0109071 A1* | 5/2006 | Thongsouk | H01F 17/0033 336/200 |
| 2006/0145805 A1* | 7/2006 | Kim | H01F 17/0006 336/200 |
| 2007/0085648 A1* | 4/2007 | Lee | H01F 17/0033 336/200 |
| 2007/0090912 A1* | 4/2007 | Lee | H01F 17/0013 336/200 |
| 2009/0058589 A1* | 3/2009 | Chen | H01F 17/0013 336/200 |
| 2013/0271909 A1 | 10/2013 | Chen et al. | |

OTHER PUBLICATIONS

Gao, Si-Ping et al., "Common-Mode Filter using Cavity-Backed Defected Ground Structure for Multilayer PCB," 2016 Asia-Pacific International Symposium on Electromagnetic Compatibility (APEMC), Shenzhen, 2016, pp. 916-918.

* cited by examiner

SOLENOID FILTER BUILT INTO A PRINTED CIRCUIT BOARD

BACKGROUND

Communication and information devices often include electric circuits implemented on printed circuit boards (PCBs). These circuits can be affected by internal or external sources of noise that enter the electrical circuits by electromagnetic induction, electrostatic coupling, or conduction. This electromagnetic interference (EMI, also referred to as radio-frequency interference (RFI)) can degrade the performance of an electric circuit or, if the EMI is significant enough, prevent it from functioning altogether. The wireless communication bands around 900 MHz, 1.8 GHz, 1.9 GHz, 2.4 GHz, 5.8 GHz, and others are susceptible to EMI and can disrupt the operation of nearby electronic devices.

Filters can be used to mitigate EMI. For example, an EMI filter may include one or more resistors, capacitors, and/or inductors, where the values of the selected components determine the cutoff frequency of the EMI filter. Because discrete components such as resistors, capacitors, and inductors have manufacturing tolerances, it can be difficult and/or expensive to ensure that an implemented EMI filter has the intended cutoff frequency or stopband. Furthermore, discrete components are mounted to the surface of a PCB and therefore consume valuable surface area.

As an alternative to filters composed of resistors, capacitors, and/or inductors, or in conjunction with other components, ferrite beads may be used to attenuate or suppress EMI in electrical circuits, such as in PCBs. For example, a ferrite bead may be inserted to filter a DC power supply circuit that may carry unwanted EMI signals. The desired signals pass through the filter, and the undesired EMI is attenuated by the filter. The attenuation results from the frequency-sensitive impedance of the ferrite bead. Direct currents and low-frequency currents see only the conductor of the ferrite bead and are, therefore, unaffected. Higher-frequency energy couples with the ferrite bead, thereby developing impedance that has inductive and resistive components. When a signal trace passes through a ferrite core, low-frequency energy is transmitted with little loss, whereas higher-frequency energy encounters the inductive reactance caused by the real part of the complex permeability of the ferrite bead. The inductive reactance reduces the conducted EMI current and introduces an insertion loss, thereby improving (i.e., reducing) the circuit's sensitivity to EMI. Although ferrite beads can effectively combat EMI, ferrite beads tend to be expensive relative to resistors, capacitors, and inductors, and they result in additional series resistance in power traces. Moreover, ferrite beads are surface-mounted components and therefore, like other discrete components, consume valuable space on a PCB.

Therefore, there is an ongoing need for alternative ways to combat EMI in PCBs.

SUMMARY

Disclosed herein PCBs with built-in solenoid filters to mitigate EMI, and data storage devices (e.g., hard disk drives) comprising such PCBs. Specifically, the solenoid filters reduce common-mode RF interference by impeding changes in the electric current on DC supply or signal traces without appreciably degrading the desired signals, which may be, for example, low-frequency signals (e.g., power, voice coil motor VCM), dual-stage actuator (DSA), etc.). The filtered frequency range can be tuned by modifying the number of turns, length, and width of the embedded solenoid. The disclosed solenoid filters provide broadband interference signal reduction and do not add series resistance to the filtered signal traces, and thus they introduce fewer parasitics that tend to degrade higher-frequency signals. Moreover, a single solenoid filter can filter multiple signal traces. Because the solenoid filters are built into the PCB, they do not result in any additional component cost, nor do they consume valuable surface area on the PCB, and they are insensitive to the manufacturing tolerances that are common in discrete components such as resistors and capacitors.

PCBs with embedded solenoid filters as described herein may be useful in a variety of applications and electronic devices. As just one example, a PCB with an embedded solenoid filter as described herein may be included in a storage device, such as, for example, a hard disk drive. For example, the solenoid filter may be positioned adjacent to the connector to maximize its impact.

In some embodiments, a printed circuit board comprises a first layer comprising a first plurality of solenoid traces, a second layer comprising a second plurality of solenoid traces, and at least one middle layer between the first and second layers. The first plurality of solenoid traces includes a first solenoid trace and a second solenoid trace, each of the first and second solenoid traces having a first end and a second end, wherein the first solenoid trace is oriented substantially parallel to the second solenoid trace in a plane of the first layer. The second plurality of solenoid traces includes a third solenoid trace and a fourth solenoid trace, each of the third and fourth solenoid traces having a first end and a second end, wherein the third solenoid trace is oriented substantially parallel to the fourth solenoid trace in a plane of the second layer, the plane of the second layer being parallel to the plane of the first layer. The at least one middle layer comprises at least one signal trace and a plurality of vias extending through the at least one middle layer in a direction substantially perpendicular to a plane of the at least one middle layer, the plane of the at least one middle layer being parallel to the plane of the first layer, the plurality of vias including a first via, a second via, and a third via. The second end of the first solenoid trace is connected to the second end of the third solenoid trace by the first via, the first end of the third solenoid trace is connected to the first end of the second solenoid trace by the second via, the second end of the second solenoid trace is connected to the second end of the fourth solenoid trace by the third via, and the at least one signal trace is oriented between the first and second vias in a direction substantially parallel to an axis extending in the plane of the at least one middle layer from the first via to the third via.

In some embodiments, the first layer further includes a fifth solenoid trace having a first end and a second end, wherein the fifth solenoid trace is oriented substantially parallel to the first and second solenoid traces in the plane of the first layer; the at least one middle layer further comprises a fourth via and a fifth via, each of the fourth and fifth vias extending through the at least one middle layer in the direction substantially perpendicular to the plane of the second layer; and the second layer further includes a sixth solenoid trace having a first end and a second end, wherein the sixth solenoid trace is oriented substantially parallel to the third and fourth solenoid traces in the plane of the second layer. In some such embodiments, the first end of the fourth solenoid trace is connected to the first end of the fifth solenoid trace by the fourth via, and the second end of the fifth solenoid trace is connected to the second end of the sixth solenoid trace by the fifth via.

In some embodiments, the at least one middle layer comprises a plurality of layers, and each of the plurality of vias extends through each of the plurality of layers.

In some embodiments, the at least one signal trace comprises at least two signal traces. In some embodiments, the at least one signal trace is a single-ended trace. In some embodiments, the at least one signal trace is configured to provide power to at least a portion of the printed circuit board.

In some embodiments, the first plurality of solenoid traces comprises at least eight solenoid traces, including the first and second solenoid traces, the second plurality of solenoid traces comprises at least eight solenoid traces, including the third and fourth solenoid traces, and the plurality of vias includes at least sixteen vias, including the first, second, and third vias.

In some embodiments, the first layer further comprises a third plurality of solenoid traces, the third plurality of solenoid traces including a fifth solenoid trace and a sixth solenoid trace, each of the fifth and sixth solenoid traces having a first end and a second end, wherein the fifth solenoid trace is oriented substantially parallel to the sixth solenoid trace in the plane of the first layer. Furthermore, the second layer further comprises a fourth plurality of solenoid traces, the fourth plurality of solenoid traces including a seventh solenoid trace and an eighth solenoid trace, each of the seventh and eighth solenoid traces having a first end and a second end, wherein the seventh solenoid trace is oriented substantially parallel to the eighth solenoid trace in the plane of the second layer. In addition, the plurality of vias further includes a fourth via, a fifth via, and a sixth via, the second end of the seventh solenoid trace is connected to the second end of the fifth solenoid trace by the fourth via, the first end of the fifth solenoid trace is connected to the first end of the eighth solenoid trace by the fifth via, the second end of the eighth solenoid trace is connected to the second end of the sixth solenoid trace by the sixth via, and the signal trace extends between the fourth and fifth vias in the direction substantially parallel to the axis extending in the second plane from the first via to the third via. In some such embodiments, a first angle between a direction of the first solenoid trace and a direction of the fifth solenoid trace is nonzero, and a second angle between a direction of the third solenoid trace and a direction of the seventh solenoid trace is nonzero.

In some embodiments, a printed circuit board comprises a least three layers, a solenoid embedded within the at least three layers, and at least one trace extending through the solenoid. In some embodiments, the at least one trace is configured to carry a single-ended signal (e.g., a power signal).

In some embodiments, the solenoid is a first solenoid, and the PCB further comprises a second solenoid embedded within the at least three layers. A wind direction of the second solenoid may be opposite a wind direction of the first solenoid.

In some embodiments, the at least three layers include a first layer, a second layer, and at least one middle layer, and the solenoid comprises a first plurality of solenoid traces on the first layer, all of the first plurality of solenoid traces oriented substantially parallel to each other, a second plurality of solenoid traces on the second layer, all of the second plurality of solenoid traces oriented substantially parallel to each other and a plurality of vias extending perpendicularly through the at least one middle layer, the plurality of vias coupling the first plurality of solenoid traces to the second plurality of solenoid traces.

In some embodiments, the PCB includes two solenoids. In some such embodiments, the PCB further comprises a second solenoid having a third plurality of solenoid traces on the first layer, all of the third plurality of solenoid traces oriented substantially parallel to each other, a fourth plurality of solenoid traces on the second layer, all of the fourth plurality of solenoid traces oriented substantially parallel to each other, and a second plurality of vias extending perpendicularly through the at least one middle layer, the second plurality of vias coupling the third plurality of solenoid traces to the fourth plurality of solenoid traces. In some embodiments having two solenoids, a wind direction of the second solenoid is opposite a wind direction of the first solenoid.

BRIEF DESCRIPTION OF THE DRAWINGS

Objects, features, and advantages of the disclosure will be readily apparent from the following description of certain embodiments taken in conjunction with the accompanying drawings in which.

To facilitate understanding, identical reference numerals have been used, where possible, to designate elements that are common to the figures. It is contemplated that elements disclosed in one embodiment may be beneficially utilized on other embodiments without specific recitation.

DETAILED DESCRIPTION

In the following, reference is made to embodiments of the disclosure. It should be understood, however, that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim.

Figure 1:
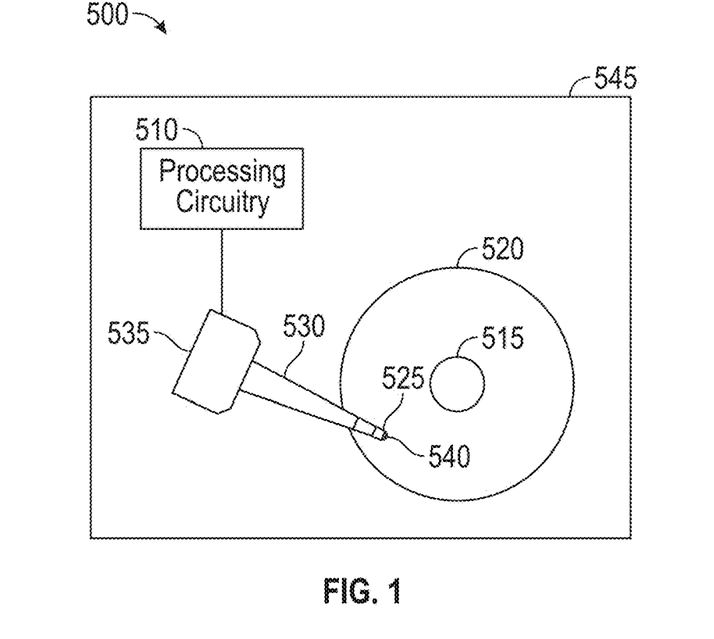
FIG. 1 illustrates several components of an exemplary hard disk drive in accordance with some embodiments.

EMI can cause problems in numerous types of electronic equipment, including, as just one example, data storage devices such as hard disk drives. FIG. 1 illustrates several components of an exemplary hard disk drive 500 that may include some embodiments. The magnetic hard disk drive 500 includes a spindle 515 that supports and rotates a magnetic disk 520. The spindle 515 is rotated by a spindle motor (not shown) that is controlled by a motor controller (not shown) that may be implemented in electronics of the hard disk drive 500. A slider 525, which is supported by a suspension and actuator arm 530, includes a combined read and write magnetic head 540. An actuator 535 rotatably positions the suspension and actuator arm 530 over the magnetic disk 520. The components of the hard disk drive 500 may be mounted on a housing 545. It is to be understood that although FIG. 1 illustrates a single disk 520, a single slider 525, a single head 540, and a single suspension and actuator arm 530, hard disk drive 500 may include a plurality (i.e., more than one) of disks 520, sliders 525, heads 540, and suspension and actuator arms 530.

The slider 525 has a gas-bearing surface that faces the surface of the disk 520 and counteracts a preload bias that pushes the slider toward the disk 520. For convenience, in this document the gas-bearing surface is referred to as the air-bearing surface (ABS) and the gas is generally referred to as "air," although it is to be understood that the gas used in a hard disk drive 500 may be a gas other than air (e.g., the gas may be helium). For simplicity, throughout this disclosure, the surface of the slider 525 that faces or that will eventually face the disk 520 is referred to as the ABS.

As the disk 520 rotates, the disk 520 drags air under the slider 525 and along the ABS in a direction approximately parallel to the tangential velocity of the disk 520. As the air passes under the ABS, air compression along the air flow path causes the air pressure between the disk 520 and the ABS to increase, which creates a hydrodynamic lifting force that counteracts the tendency of the suspension and actuator arm 530 to push the slider 525 toward the disk 520. The slider 525 thus flies above the disk 520 but in close proximity to the surface of the disk 520.

In operation, the actuator 535 moves the suspension and actuator arm 530 to position the slider 525 so that the magnetic head 540 is in a transducing relationship with the surface of the magnetic disk 520. The head 540 may be used to write information to one or more tracks on the surface of the disk 520 and to read previously-recorded information from the tracks on the surface of the disk 520. Processing circuitry 510 provides to the head 540 signals representing information to be written to the disk 520 and receives from the head 540 signals representing information read from the disk 520. The processing circuitry 510 also provides signals to the spindle motor to rotate the magnetic disk 520, and to the actuator 535 to move the slider 525 to various tracks.

For writing, the head 540 may use a single pole writer that has a main pole surrounded by magnetic shield materials. The main pole is typically separated from the magnetic shield materials by a non-magnetic spacer. The main pole may have a tapered shape with a tip that faces the magnetic recording media and is part of the ABS. The single pole writer may include a conductive coil encircling the writer pole in a helical or pancake like configuration.

To write to the disk 520, the slider 525 passes over a region of the disk 520, and an electric current is applied through the coil of the head 540, which causes a large magnetic field to be generated from the main pole tip. The polarity of the generated field causes a region of the magnetic disk 520 to assume a polarity, thus enabling information to be stored on the disk 520.

To read information from the disk 520, the head 540 may include only one read sensor, or it may include multiple read sensors. The read sensor(s) in the head 540 may include, for example, one or more giant magnetoresistance (GMR) sensors, tunneling magnetoresistance (TMR) sensors, or another type of magnetoresistive sensor. When the slider 525 passes over a region of the disk 520, the head 540 detects changes in resistance due to magnetic field variations recorded on the disk 520, which represent the recorded bits.

Figure 2:
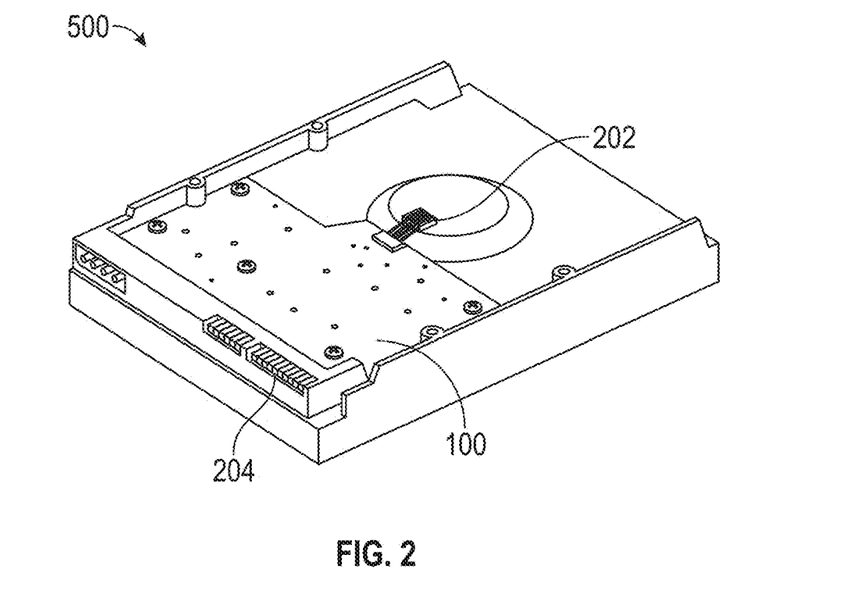
FIG. 2 is a schematic bottom illustration of a hard disk drive that includes a printed circuit board.

FIG. 2 is a schematic bottom illustration of a hard disk drive 500 including a PCB 100 that may include some embodiments. The PCB 100 has electrical connections 202 to other components of the hard disk drive 500 and electrical connections 204 to be used to connect the hard disk drive 500 to a device (e.g., a computer) that will use the hard disk drive 500.

Hard disk drives 500 can suffer from EMI caused by various external devices, including, for example, cellular phones and other radio communication devices. The EMI can be conducted inside of the hard disk drive 500 through, for example, the P2 connector traces (where P2 refers to the PCB connector to the flexible circuit that is supported by the actuator) and appear as added noise to the sensitive front-end region (e.g., the preamplifier, suspension, slider, reader). The additional noise can degrade performance or, in severe cases, result in drive stoppage. Prior-art solutions to mitigate such EMI use discrete components (e.g., resistors, capacitors, inductors, ferrite beads, etc.) mounted to the surface of the PCB, which adds component cost, consumes space on the PCB, and results in added series resistance (~0.1 ohm) in power traces.

Figure 3A:
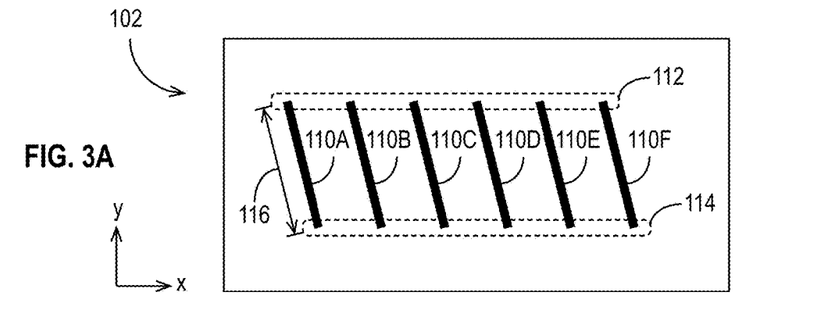
FIGS. 3A-3D illustrate an exemplary PCB with a solenoid filter embedded in three layers of the PCB in accordance with some embodiments.

Disclosed herein are solenoid filters built into PCBs to mitigate EMI. The solenoid filters reduce common-mode RF interference by impeding changes in the electric current on signal traces without appreciably degrading the desired signals. FIGS. 3A-3D illustrate an exemplary PCB 100 with an embedded solenoid filter 101 in accordance with some embodiments, with FIG. 3D providing a top view of the PCB 100, and FIGS. 3A-3C providing individual layer views. The PCB 100 includes three layers: a first layer 102, at least one middle layer 104 (which, as its name implies, may include more than one layer), and a second layer 106. For convenience, the surfaces of the three layers 102, 104, and 106 are in the x-y plane in a rectangular coordinate system. The solenoid filter 101 is embedded in the three layers. FIG. 3A illustrates the first layer 102, which includes a first plurality of solenoid traces 110, namely the solenoid traces 110A, 110B, 110C, 110D, 110E, and 110F. Each solenoid trace 110 in the first layer 102 has a first end 112, a second end 114, and a length 116. As illustrated in FIG. 3A, all of the solenoid traces 110 in the first layer 102 are substantially parallel to each other and have the same lengths 116.

Figure 3B:
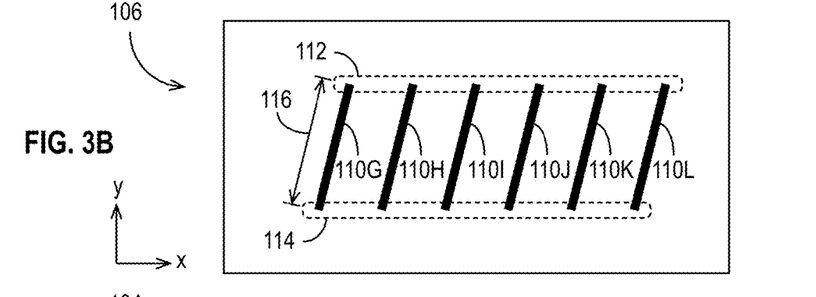

FIG. 3B illustrates the second layer 106, which includes a second plurality of solenoid traces 110, namely the solenoid traces 110G, 110H, 110I, 110J, 110K, and 110L. Each solenoid trace 110 in the second layer 106 has a first end 112, a second end 114, and a length 116, which is substantially identical to the length of each of the solenoid traces 110 in the first layer. As illustrated in FIG. 3B, all of the solenoid traces 110 in the second layer 106 are substantially parallel to each other, but they are at an angle relative to the solenoid traces 110 in the first layer 102.

Figure 3C:
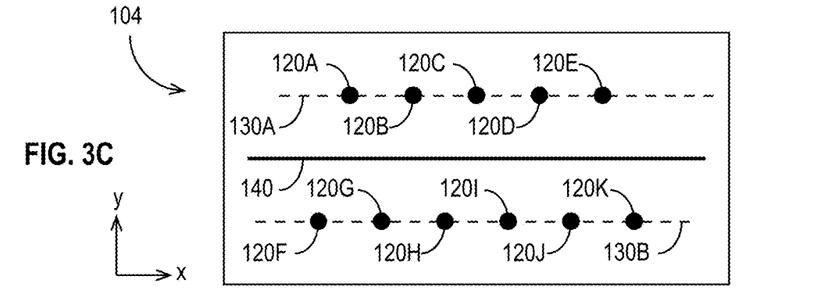

FIG. 3C illustrates the at least one middle layer 104, which includes at least one signal trace 140 and a plurality of vias 120 extending through the at least one middle layer 104 in the z-direction (i.e., perpendicular to the x-y plane shown in FIGS. 3A-3D). For a solenoid filter 101 that includes a single solenoid, the number of vias 120 extending through the at least one middle layer 104 is one fewer than the total number of solenoid traces 110 in the first layer 102 and the second layer 106. Thus, in the exemplary embodiment of FIG. 3C, the at least one middle layer 104 includes eleven vias 120, namely vias 120A, 120B, 120C, 120D, 120E, 120F, 120G, 120H, 120I, 120J, and 120K. The vias 120A, 120B, 120C, 120D, and 120E are arranged linearly along a first axis 130A extending in the x-direction, and the vias 120F, 120G, 120H, 120I, 120J, and 120K are arranged linearly along a second axis 130B extending in the x-direction. The at least one signal trace 140, which may be, for example, a single-ended trace (e.g., power), extends in the x-direction parallel to and disposed between the first and second axes 130A, 130B.

When the at least one middle layer 104 is sandwiched between the first layer 102 and the second layer 106, each of the vias 120 connects a first end 112 of a first solenoid trace 110 to a first end 112 of a second solenoid trace 110, or a second end 114 of a first solenoid trace 110 to a second end 114 of a second solenoid trace 110. For example, with the solenoid traces 110 oriented in the first layer 102 and the second layer 106 as shown, respectively, in FIGS. 3A and 3B, the via 120A connects the first end 112 of the solenoid trace 110B (in the first layer 102) to the first end 112 of the solenoid trace 110G (in the second layer 106), the via 120F connects the second end 114 of the solenoid trace 110A (in the first layer 102) to the second end 114 of the solenoid trace 110G (in the second layer 106), and the via 120G connects the second end 114 of the solenoid trace 110B (in the first layer 102) to the second end 114 of the solenoid trace 110H (in the second layer 106). Likewise, the via 120B connects the first end 112 of the solenoid trace 110C (in the first layer 102) to the first end 112 of the solenoid trace 110H (in the second layer 106), and the via 120H connects the second end 114 of the solenoid trace 110C (in the first layer 102) to the second end 114 of the solenoid trace 110I (in the second layer 106). When the first layer 102, the at least one middle layer 104, and the second layer 106 have been fused together, the solenoid filter 101 has a length 150 and a width 160. The length 150 and width 160 can be determined, using trigonometry, based on the lengths 116 of the solenoid traces 110 and the angles between the solenoid traces 110 in the first layer 102 and the solenoid traces 110 in the second layer 106. Alternatively, given the width 160, length 150, and number of turns of the solenoid, the angles between the solenoid traces 110 may be determined. As just one example, a solenoid filter 101 may include a single solenoid having eight turns, a width 160 of 4.6 mm, and a length 150 of 13.8 mm. The angles between the solenoid traces 110 are then 28.1 degrees.

Figure 3D:
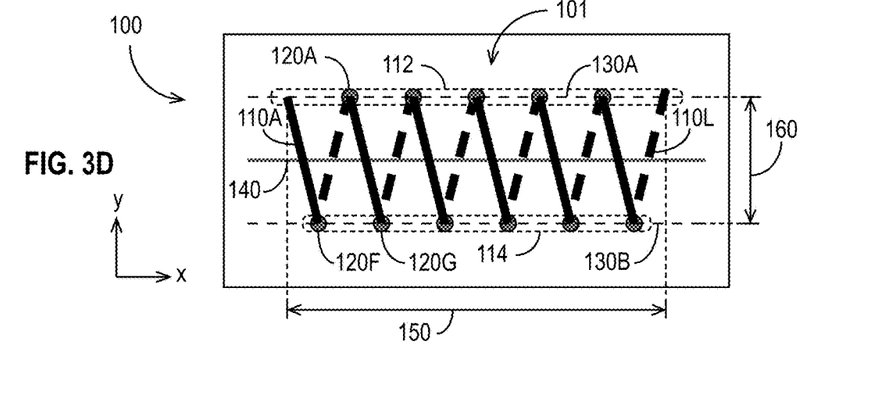

FIG. 3D illustrates the PCB 100 in the x-y plane assuming that the second layer 106 of FIG. 3B is below the at least one middle layer 104 of FIG. 3C, which is below the first layer 102 of FIG. 3A. The solenoid traces 110 in the second layer 106 are illustrated as dashed lines to indicate they are not visible on the surface of the PCB 100, which is presumed to be the first layer 102. Likewise, the vias 120 are illustrated in gray to indicate they are in the at least one middle layer 104. As shown, the signal trace 140, which is on the at least one middle layer 104, passes through the solenoid filter 101 created when the first layer 102, at least one middle layer 104, and second layer 106 are sandwiched together as explained.

Although FIGS. 3A-3D illustrate a solenoid with six turns, it is to be understood that solenoid filter 101 may include more or fewer turns. Furthermore, although FIG. 3C illustrates the at least one middle layer 104 as a single layer, the at least one middle layer 104 may include additional layers that are also sandwiched between the first layer 102 and the second layer 106, as long as the signal trace 140 remains approximately centered in the y- and z-directions within the solenoid filter 101 and the vias 120 pass through all of the layers residing between the first layer 102 and the second layer 106. Thus, for example, the at least one middle layer 104 may comprise multiple layers (e.g., three layers). Moreover, although FIGS. 3B and 3D illustrate only a single signal trace 140, the solenoid filter 101 may filter more than one signal trace 140. For example, the solenoid filter 101 may filter at least two signal traces 140, which may be, for example, single-ended signal traces.

Figure 4A:
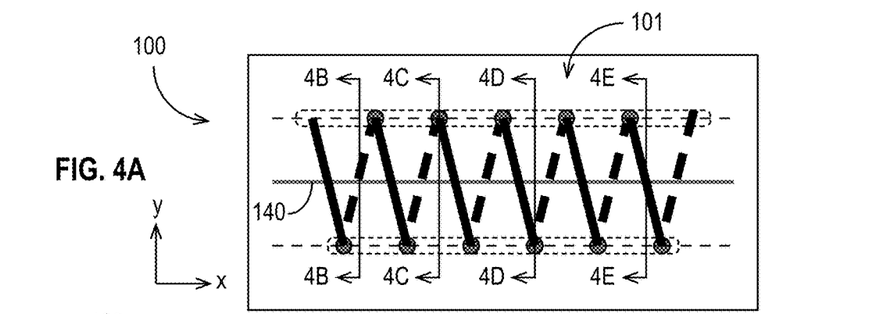
FIG. 4A illustrates the PCB of FIG. 3D, but without various reference characters.
Figure 4B:
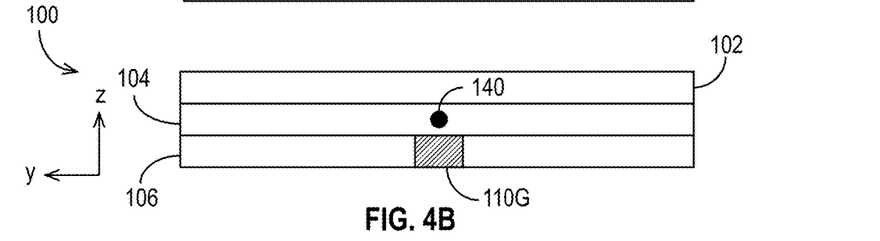
FIG. 4B shows the cross-section of the PCB shown in FIGS. 3A-3D taken at the line labeled 4B-4B in FIG. 4A.
Figure 4C:
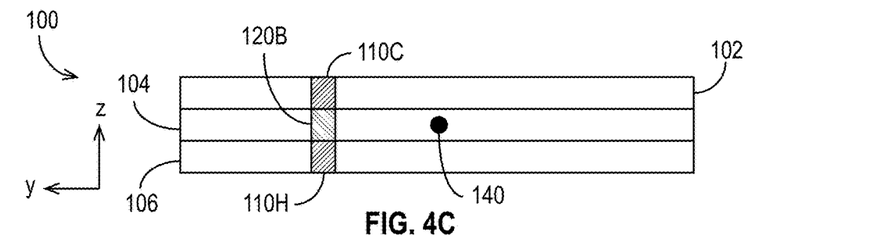
FIG. 4C shows the cross-section of the PCB shown in FIGS. 3A-3D taken at the line labeled 4C-4C in FIG. 4A.
Figure 4D:
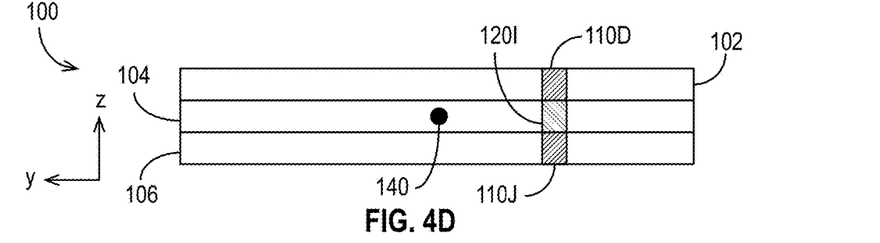
FIG. 4D shows the cross-section of the PCB shown in FIGS. 3A-3D taken at the line labeled 4D-4D in FIG. 4A.
Figure 4E:
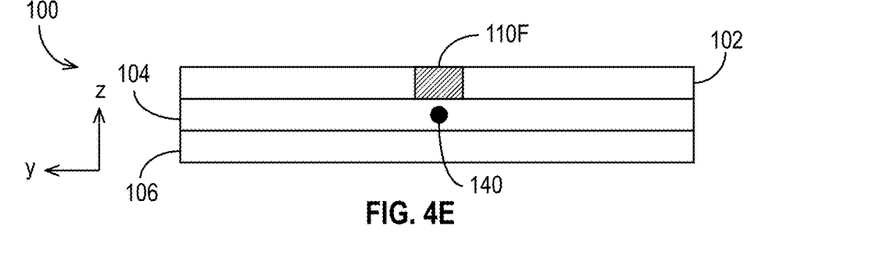
FIG. 4E shows the cross-section of the PBC shown in FIGS. 3A-3D taken at the line labeled 4E-4E in FIG. 4A.

FIG. 4A illustrates the PCB 100 with the solenoid filter 101 of FIG. 3D, but without various reference characters. FIG. 4A identifies four cross-section locations parallel to the y-axis, namely cross-sections taken at the lines labeled 4B-4B, 4C-4C, 4D-4D, and 4E-4E. FIGS. 4B-4E illustrate the resulting cross-sections in the y-z plane. As shown in FIG. 4B, the cross-section taken at the line labeled 4B-4B intersects the solenoid trace 110G in the second layer 106 and the signal trace 140 in the at least one middle layer 104. As shown in FIG. 4C, the cross-section taken at the line labeled 4C-4C intersects the solenoid trace 110C in the first layer 102, the via 102B and the signal trace 140 in the at least one middle layer 104, and the solenoid trace 110H in the second layer 106. As shown in FIG. 4D, the cross-section taken at the line labeled 4D-4D intersects the solenoid trace 110D in the first layer 102, the via 102I and the signal trace 140 in the at least one middle layer 104, and the solenoid trace 110J in the second layer 106. As shown in FIG. 4E, the cross-section taken at the line labeled 4E-4E intersects the solenoid trace 110F in the first layer 102 and the signal trace 140 in the at least one middle layer 104.

Figure 5:
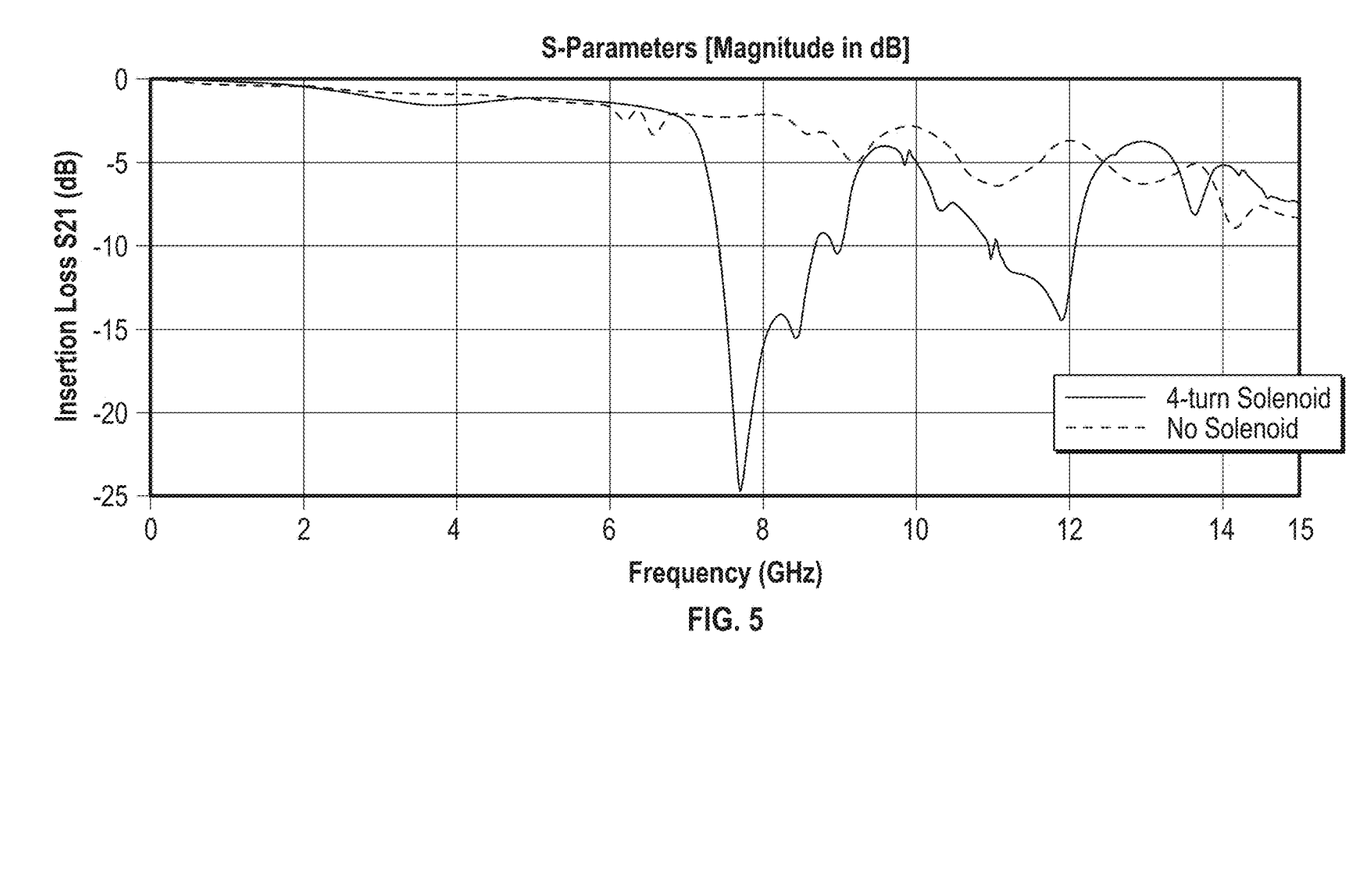
FIG. 5 illustrates the insertion loss of an exemplary solenoid filter.

To illustrate the effect of the solenoid filter 101, FIG. 5 illustrates the insertion loss, in dB, of a 4-turn solenoid filter 101 that has a width 160 of 4.6 mm. It is to be understood that the term "insertion loss" is commonly used by skilled artisans to describe plots such as the one shown in FIG. 5, even though the more semantically correct term is "insertion gain" (i.e., the solenoid filter 101 provides a negative gain and therefore attenuates the unwanted noise), sometimes referred to as "signal transfer." As shown in FIG. 5, the solenoid filter 101 attenuates surface current by at least 10 dB and up to nearly 25 dB in the frequency range from about 7.5 GHz to around 8.5 GHz. Likewise, the solenoid filter 101 provides attenuation of at least 5 dB in the frequency range from about 10 GHz to about 12 GHz. In comparison, without any solenoid filter 101, the surface current is significant across the entire illustrated frequency range.

Figure 6:
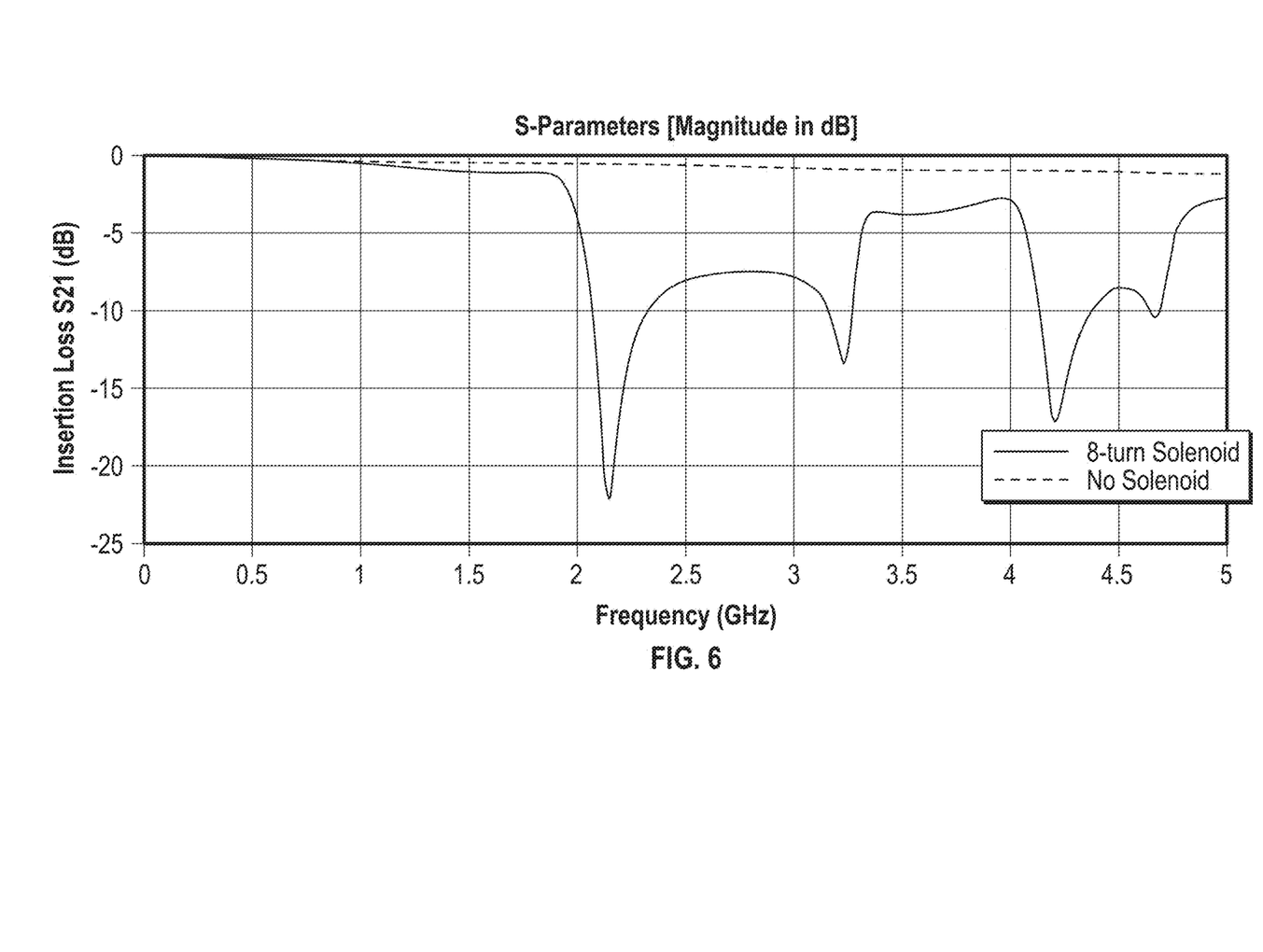
FIG. 6 illustrates the insertion loss of another exemplary solenoid filter.

The bandwidth and insertion loss of the solenoid filter 101 can be tuned by selecting an appropriate number of turns in the solenoid filter 101. FIG. 6 illustrates the insertion loss of an 8-turn solenoid filter 101 that, like the solenoid of FIG. 5, has a width of 4.6 mm. Increasing the number of turns in the solenoid increases the inductance, and, therefore, the effect of the additional turns is to shift the stopband lower in frequency because the resonant frequency is inversely proportional to the square root of the product of the inductance and the capacitance. As shown in FIG. 6, the 8-turn solenoid filter 101 provides at least 5 dB of attenuation in the band from approximately 2 GHz to about 3.3 GHz.

Figure 7:
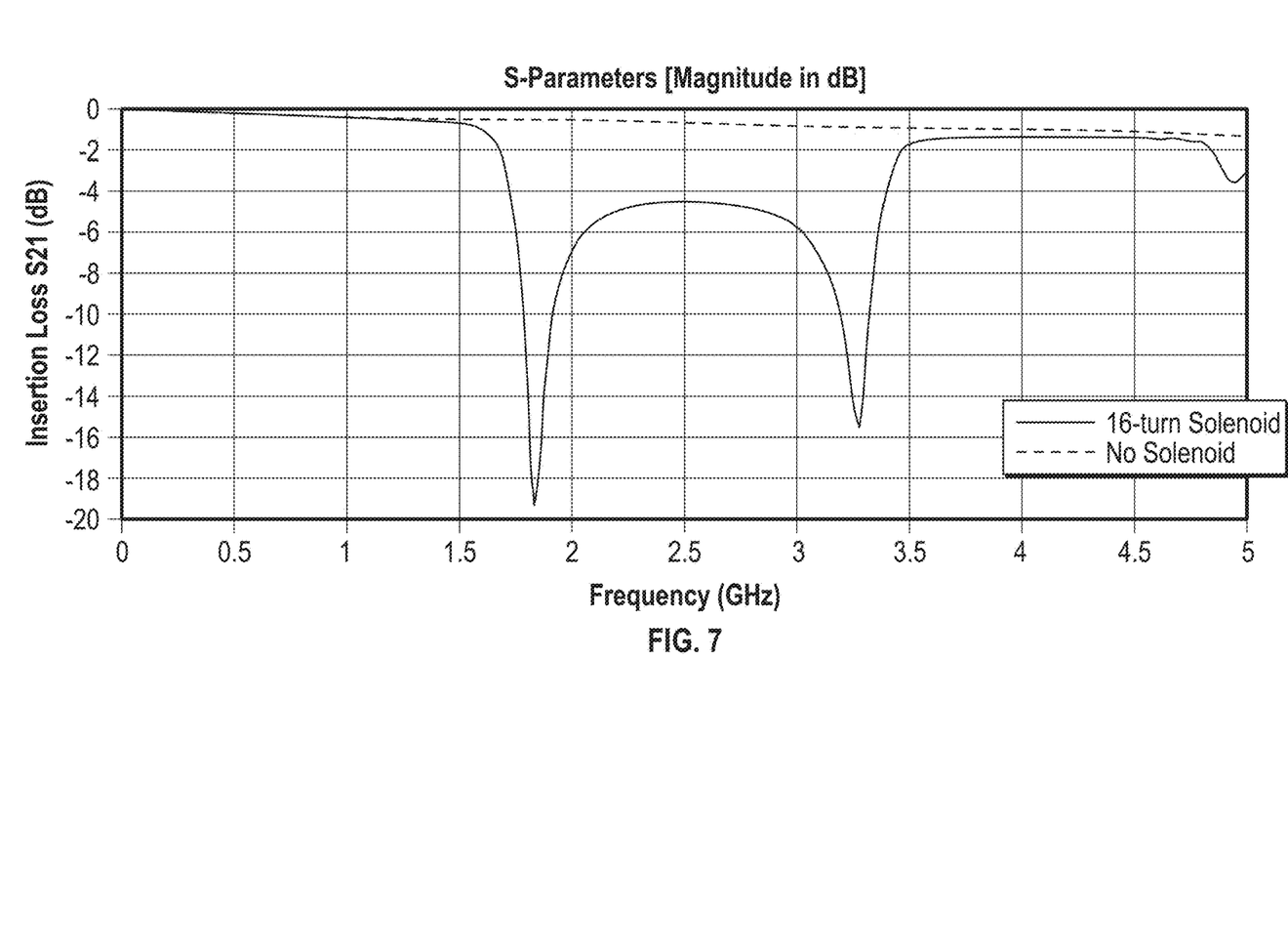
FIG. 7 illustrates the insertion loss of another exemplary solenoid filter.

FIG. 7 illustrates the insertion loss of a 16-turn solenoid filter 101 that, like the solenoid filters 101 of FIGS. 5 and 6, has a width of 4.6 mm. The effect of the additional turns is to shift the stopband even lower in frequency. As shown in FIG. 7, the 16-turn solenoid filter 101 provides at least 4 dB of attenuation in the frequency range from approximately 1.7 GHz to about 3.4 GHz. Thus, FIGS. 5-7 illustrate that solenoid filters 101 with more turns provide filtering at lower frequencies than solenoid filters 101 with fewer turns.

Figure 8:
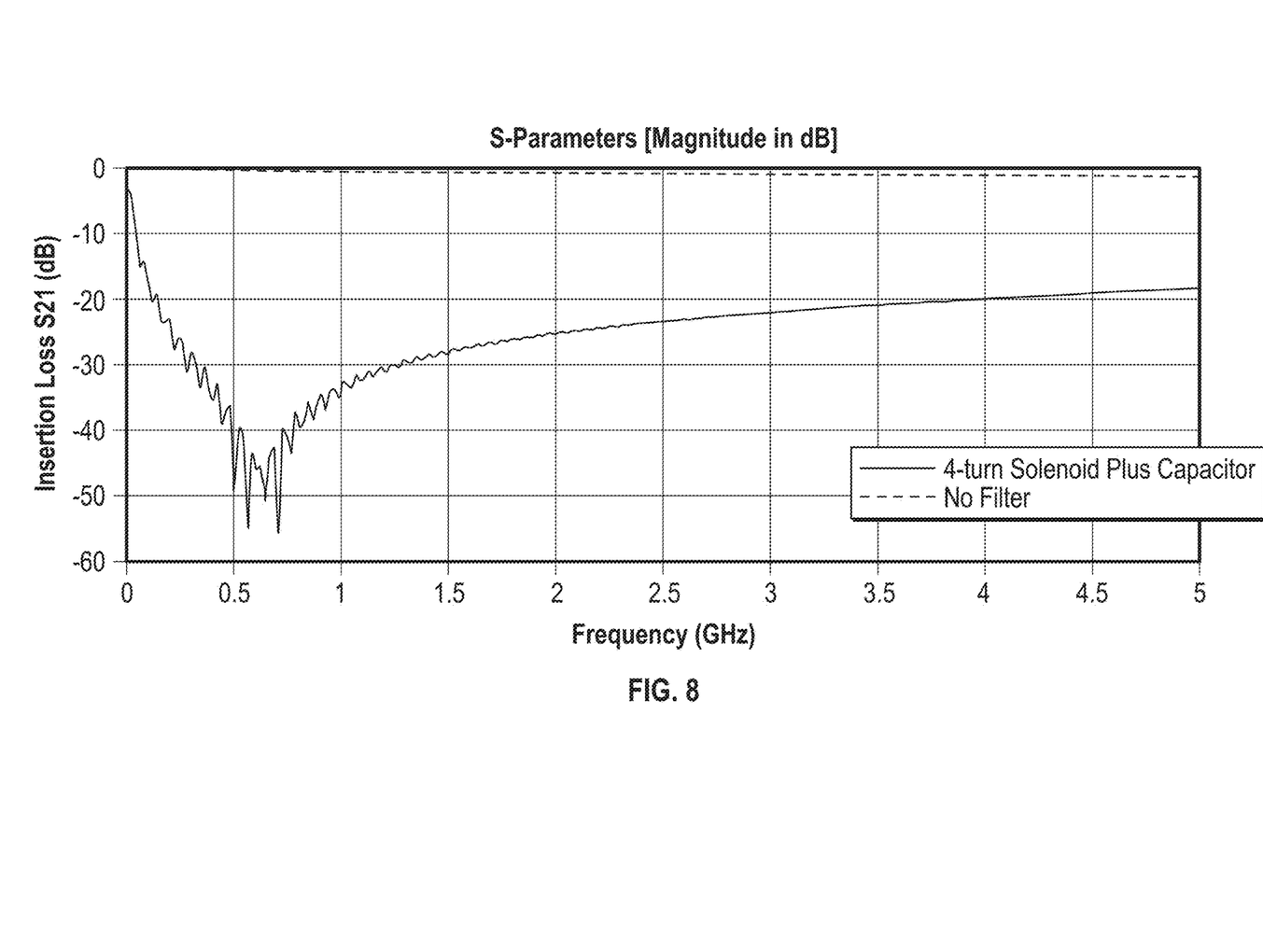
FIG. 8 illustrates the insertion loss of an exemplary solenoid filter that includes a solenoid and a surface-mounted capacitor.

Although one of the advantages of the solenoid filters 101 disclosed herein is that they may be used in PCBs without additional surface components, the use of surface components is not in any manner precluded. For example, a surface-mounted capacitor may be included on a PCB 100 to provide capacitance and shift the stopband even lower in frequency. One lead of a surface component, such as a capacitor, may be connected, for example, to one of the ends of the solenoid or at any point along the solenoid, and the other lead may be connected to a ground plane. FIG. 8 illustrates the insertion loss for a solenoid filter 101 that includes a 4-turn, 4.6-mm-wide solenoid and a surface-mounted 470-pF capacitor. As shown by FIG. 8, this embodiment of the solenoid filter 101 provides at least 10 dB of attenuation in the frequency band starting from below 0.1 GHz and extending above 5 GHz. Thus, the use of even a single surface-mounted component (e.g., a capacitor) allows the stopband of the solenoid filter 101 to be tuned to lower frequencies than the solenoid alone can produce.

Thus, as illustrated by FIGS. 5-8, a single solenoid embedded in a PCB, whether alone or in conjunction with a surface-mounted capacitor, can provide significant reductions in EMI susceptibility by routing signal traces through the solenoid, and the frequency range over which the solenoid filter 101 provides attenuation can be tuned by selecting an appropriate number of turns, an appropriate length 150, an appropriate width 160, and, in the case a surface-mounted component (e.g., a capacitor) is included, an appropriate value for that component. The desired frequency immunity range determines the number of turns for the available PCB layout area, and the length and width can be adjusted along with the number of turns. For example, a narrow layout may have more turns with a narrow width, whereas a wider layout may have fewer turns with a shorter length. The solenoid will provide inductance that is proportional to the product of its cross-sectional area and the square of the number of turns, and inversely proportional to the length of the solenoid. The flexibility to use or not use surface-mounted components in conjunction with a solenoid in the solenoid filter 101 allows designers to conserve or use surface space on the PCB 100 in implementing the solenoid filter 101.

Multiple embedded solenoids may be connected in series to tune the stopband further. For example, in some embodiments, a solenoid filter 101 includes two solenoids connected in series but with opposite orientations (i.e., a first solenoid has a first wind direction (i.e., clockwise or counterclockwise in the y-z plane) and the second solenoid has a wind direction opposite that of the first wind direction).

Figure 9A:
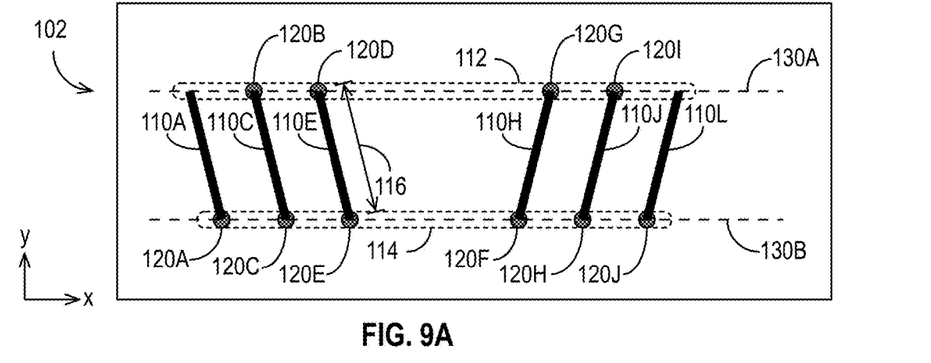
FIGS. 9A-9C illustrate two solenoids connected in series but with opposite orientations in accordance with some embodiments.
Figure 9B:
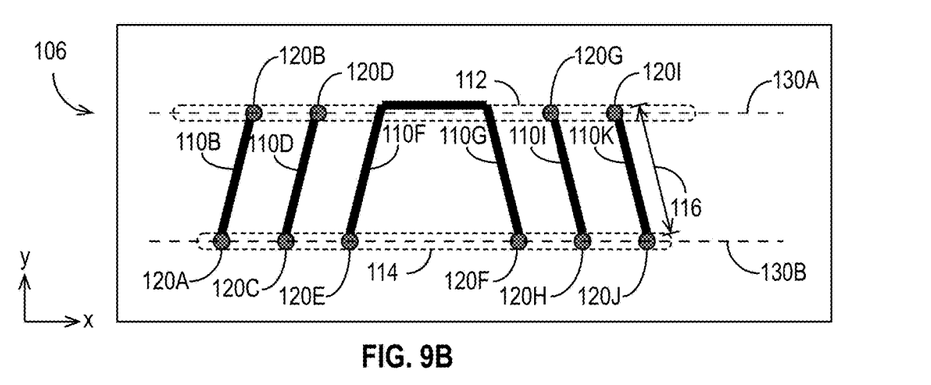
Figure 9C:
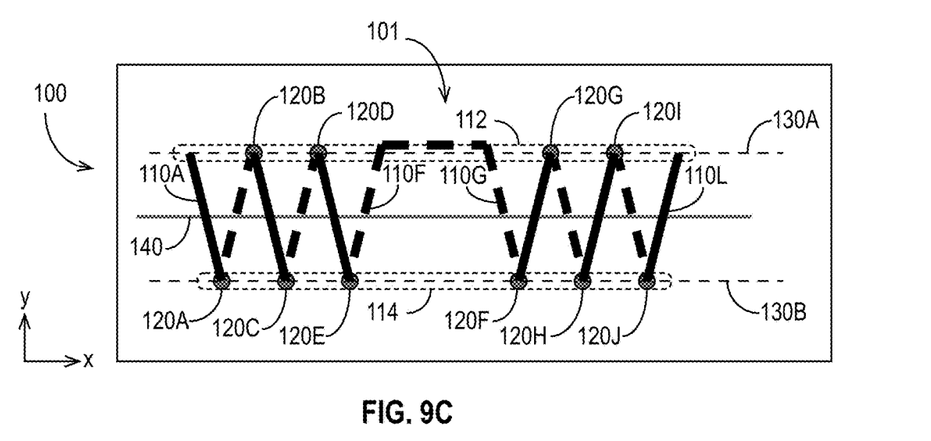

FIGS. 9A-9C illustrate an example of such an embodiment. Like the exemplary PCB 100 shown in FIGS. 3A-3D, the exemplary PCB 100 shown in FIGS. 9A-9C has three layers, namely a first layer 102, at least one middle layer 104, and a second layer 106. The at least one middle layer 104 is not illustrated separately in FIGS. 9A-9C. As before, for convenience, the surfaces of the layers 102, 104, and 106 are presumed to be in the x-y plane in a rectangular coordinate system. The solenoid filter 101 is embedded in the layers 102, 104, 106.

FIG. 9A illustrates the first layer 102 of the PCB 100 and the vias 120 of the at least one middle layer 104 that connect the solenoid traces 110 of the first layer 102 through the at least one middle layer 104 to the solenoid traces 110 of the second layer 106. The first layer 102 includes a first plurality of solenoid traces 110, namely the solenoid traces 110A, 110C, 110E, 110H, 110J, and 110L. Each solenoid trace 110 in the first layer 102 has a first end 112, a second end 114, and a length 116. As illustrated in FIG. 9A, a first half of the solenoid traces 110 in the first layer 102, namely solenoid traces 110A, 110C, and 110E, are substantially parallel to each other. Similarly, a second half of the solenoid traces 110 in the first layer 102, namely solenoid traces 110H, 110J, and 110L, are substantially parallel to each other. The second half of the solenoid traces 110 in the first layer 102 are disposed at an angle to the first half of the solenoid traces 110, and therefore they are not parallel to the first half of the solenoid traces 110. The first half of the solenoid traces 110 are at a nonzero angle to the second half of the solenoid traces 110 because they are in different solenoids. In the embodiment illustrated in FIG. 9A, the first half of the solenoid traces 110 and the second half of the solenoid traces 110 all have the same lengths 116. In other embodiments, the first half of the solenoid traces 100 all have a first length 116A, and the second half of the solenoid traces 110 all have a second length 116B.

Because the embodiment illustrated in FIGS. 9A-9C includes two solenoids, the number of vias 120 is two less than the total number of solenoid traces 110 in the first and second layers 102, 106. This is because each solenoid has a number of vias 120 equal to the number of solenoid traces 110 in that solenoid minus 1. For embodiments that include more than two solenoids connected in series, the number of vias 120 is given by (total number of solenoid traces 110)–(total number of solenoids connected in series).

FIG. 9B illustrates the second layer 106 of the PCB 100 and the vias 120 of the at least one middle layer 104 that connect the solenoid traces 110 of the second layer 106 to the solenoid traces 110 of the first layer 102. The second layer 106 includes a second plurality of solenoid traces 110, namely the solenoid traces 110B, 110D, 110F, 110G, 110I, and 110K. Each solenoid trace 110 in the second layer 106 has a first end 112, a second end 114, and a length 116. As illustrated in FIG. 9A, a first half of the solenoid traces 110 in the second layer 106, namely solenoid traces 110B, 110D, and 110F, are substantially parallel to each other. Similarly, a second half of the solenoid traces 110 in the second layer 106, namely solenoid traces 110G, 110I, and 110K, are substantially parallel to each other, but not to the first half of the solenoid traces 110. The first half of the solenoid traces 110 are at a nonzero angle to the second half of the solenoid traces 110 because they are in different solenoids. As shown in FIG. 9B, the first end 112 of the solenoid trace 110F is connected to the first end 112 of the solenoid trace 110G.

FIG. 9C illustrates the PCB 100 in the x-y plane assuming that the second layer 106 of FIG. 9B is below the at least one middle layer 104, which is below the first layer 102 of FIG.

9A. The solenoid traces 110 in the second layer 106 are illustrated as dashed lines to indicate they are not visible on the surface of the PCB 100, which is presumed to be the first layer 102. Likewise, the vias 120 are illustrated in gray to indicate they are in the at least one middle layer 104. As shown, the signal trace 140, which is on the at least one second layer 104, passes through the solenoid filter 101 created when the first layer 102, at least one middle layer 104, and second layer 106 are sandwiched together as explained.

Figure 10:
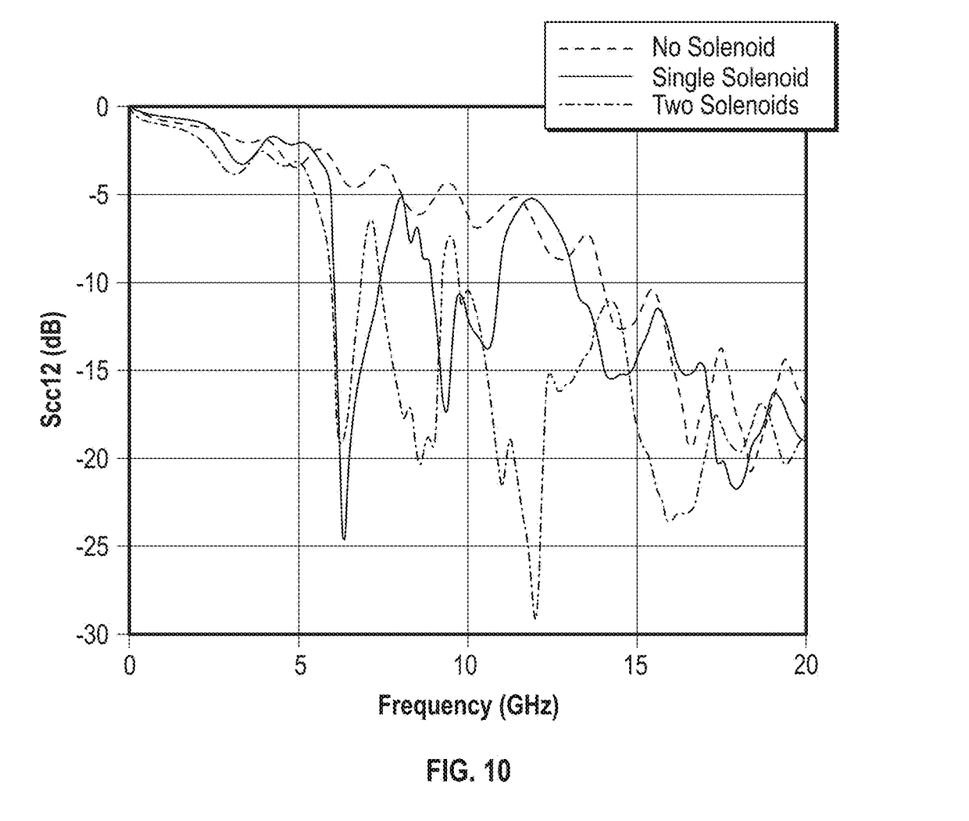
FIG. 10 is a plot comparing insertion losses of exemplary solenoid filters.

FIG. 10 is a plot illustrating how the insertion loss of the solenoid filter 101 differs with different configurations. The dashed line illustrates the measured insertion loss without any filter. The solid line illustrates the measured insertion loss when the signal traces 140 pass through a single-solenoid filter 101 having four turns and a width 160 of 4.6 mm (i.e., the solenoid filter 101 described in the context of FIG. 5). The dash-dot line illustrates the measured insertion loss when the signal traces pass through the two-solenoid filter 101 described in the context of FIG. 9, where each solenoid has four turns and has a width 160 of 4.6 mm. A comparison of the curves indicates that the solenoid filter 101 with two solenoids connected in series but with opposite orientations (i.e., opposite directions of wind) provides greater signal attenuation at most frequencies than the solenoid filter 101 that uses only one solenoid. At frequencies of approximately 10 GHz and above, the solenoid filter 101 with two solenoids connected in series but with opposite orientations provides at least 10 dB of attenuation, whereas the solenoid filter 101 with only one, 4-turn solenoid provides more than 10 dB of attenuation above about 13 GHz. Moreover, the solenoid filter 101 with two solenoids connected in series but with opposite orientations provides a deep notch between about 7 GHz and about 9.5 GHz, whereas the solenoid filter 101 with only one, 4-turn solenoid provides far less attenuation in that frequency range.

In the embodiment illustrated in FIGS. 9A-9C, all of the solenoid traces 110 have the same length 116. In other embodiments, the solenoid traces 110 of the respective solenoids connected in series do not all have the same length 116. For example, the solenoid traces 110 of one solenoid may have a first length 116A, and the solenoid traces 110 of another solenoid connected in series may have a second length 116B. Specifically, the solenoid traces 110A, 1110B, 110C, 110D, 110E, and 110F may have a first length 116A, and the solenoid traces 110G, 110H, 110I, 110J, 110K, and 110L may have a second length 116B that is either longer or shorter than the first length 116A. Thus, the widths 160 of the two solenoids connected in series and embedded within PCB 100 may be different. Furthermore, although FIGS. 9A-9C illustrate that each of the solenoids connected in series has the same number of turns, the solenoids may have different numbers of turns. Moreover, FIGS. 9A-9C illustrate an embodiment of a solenoid filter 101 having two solenoids connected in series, but it is contemplated that more than two solenoids may be connected in series. For example, a third solenoid oriented opposite to the adjacent solenoid may be connected to either the first end 112 of the solenoid trace 110A or the first end 112 of the solenoid trace 110L. Additional solenoids may be similarly connected. In addition, FIGS. 9A-9C show the series connection between the two solenoids being made in the second layer 106, but of course the series connection may alternatively be made in the first layer 102. In embodiments including more than two solenoids, some of the series connections may be made in the first layer 102, and others of the series connections may be made in the second layer 106.

Thus, as disclosed herein, a solenoid filter 101 that includes at least one solenoid may be embedded into the layers of a PCB 100 to provide EMI mitigation to signal traces 140 passing through the solenoid(s). The frequency range(s) at which the solenoid filter 101 attenuates EMI may be tuned by an appropriate selection of the parameters of the solenoid filter 101. These parameters include, for example, the number of turns, the width of the solenoid, the number of solenoids connected in series with opposite orientations, and the optional addition of one or more surface components (e.g., capacitor(s)) on the PCB 100 as part of the solenoid filter 101.

In the foregoing description and in the accompanying drawings, specific terminology has been set forth to provide a thorough understanding of the disclosed embodiments. In some instances, the terminology or drawings may imply specific details that are not required to practice the invention.

Although this document explains aspects of certain embodiments in the context of data storage devices, using hard disk drives as examples of data storage devices, the disclosures herein are not limited to use in data storage device applications. Specifically, the various embodiments are applicable to other electronic devices with noise/interference mitigation needs. Furthermore, although certain embodiments are explained in the context of hard disk drives, and some of the drawings show a hard disk drive as an example data storage device, the various embodiments are applicable to other data storage devices such as solid state drives, solid state hybrid disk drives, optical disk drives, tape drives, and the like.

To avoid obscuring the present disclosure unnecessarily, well-known components (e.g., of a disk drive) are shown in block diagram form and/or are not discussed in detail or, in some cases, at all.

Moreover, although storage devices, and disk drives in particular, were provided as an example application in which the disclosed concepts are useful, the use of embedded solenoid filters in PCBs is not limited to storage devices. The disclosed filters are useful in other applications where PCBs are used and EMI is problematic.

Unless otherwise specifically defined herein, all terms are to be given their broadest possible interpretation, including meanings implied from the specification and drawings and meanings understood by those skilled in the art and/or as defined in dictionaries, treatises, etc. As set forth explicitly herein, some terms may not comport with their ordinary or customary meanings.

As used in the specification and the appended claims, the singular forms "a," "an" and "the" do not exclude plural referents unless otherwise specified. The word "or" is to be interpreted as inclusive unless otherwise specified. Thus, the phrase "A or B" is to be interpreted as meaning all of the following: "both A and B," "A but not B," and "B but not A." Any use of "and/or" herein does not mean that the word "or" alone connotes exclusivity.

As used herein, phrases of the form "at least one of A, B, and C," "at least one of A, B, or C," "one or more of A, B, or C," and "one or more of A, B, and C" are interchangeable, and each encompasses all of the following meanings: "A only," "B only," "C only," "A and B but not C," "A and C but not B," "B and C but not A," and "all of A, B, and C."

To the extent that the terms "include(s)," "having," "has," "with," and variants thereof are used in the detailed description or the claims, such terms are intended to be inclusive in a manner similar to the term "comprising," i.e., meaning "including but not limited to." The terms "exemplary" and "embodiment" are used to express examples, not preferences or requirements.

The terms "over," "under," "between," and "on" are used herein refer to a relative position of one feature with respect to other features. For example, one feature disposed "over" or "under" another feature may be directly in contact with the other feature or may have intervening material. Moreover, one feature disposed "between" two features may be directly in contact with the two features or may have one or more intervening features or materials. In contrast, a first feature "on" a second feature is in contact with that second feature.

The drawings are not necessarily to scale, and the dimensions, shapes, and sizes of the features may differ substantially from how they are depicted in the drawings.

Although specific embodiments have been disclosed, it will be evident that various modifications and changes may be made thereto without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A printed circuit board, comprising:
   a first layer comprising:
      a first solenoid trace and a second solenoid trace of a first solenoid, each of the first and second solenoid traces having a first end and a second end, wherein the first solenoid trace is oriented substantially parallel to the second solenoid trace in a plane of the first layer,
      a fifth solenoid trace and a sixth solenoid trace of a second solenoid, each of the fifth and sixth solenoid traces having a first end and a second end, wherein the fifth solenoid trace is oriented substantially parallel to the sixth solenoid trace in the plane of the first layer, and wherein the fifth and sixth solenoid traces are at an angle to the first and second solenoid traces;
   a second layer comprising:
      a third solenoid trace and a fourth solenoid trace of the first solenoid, each of the third and fourth solenoid traces having a first end and a second end, wherein the third solenoid trace is oriented substantially parallel to the fourth solenoid trace in a plane of the second layer, the plane of the second layer being parallel to the plane of the first layer, and
      a seventh solenoid trace and an eighth solenoid trace of the second solenoid, each of the seventh and eighth solenoid traces having a first end and a second end, wherein the seventh solenoid trace is oriented substantially parallel to the eighth solenoid trace in the plane of the second layer, and wherein the seventh and eighth solenoid traces are at an angle to the third and fourth solenoid traces; and
   at least one middle layer between the first and second layers, the at least one middle layer comprising:
      at least one signal trace, and
      a plurality of vias extending through the at least one middle layer in a direction substantially perpendicular to a plane of the at least one middle layer, the plane of the at least one middle layer being parallel to the plane of the first layer, the plurality of vias including a first via, a second via, a third via, a fourth via, a fifth via, and a sixth via,
   wherein:
      the second end of the first solenoid trace is connected to the second end of the third solenoid trace by the first via,
      the first end of the third solenoid trace is connected to the first end of the second solenoid trace by the second via,
      the second end of the second solenoid trace is connected to the second end of the fourth solenoid trace by the third via,
      the second end of the fifth solenoid trace is connected to the second end of the seventh solenoid trace by the fourth via,
      the first end of the fifth solenoid trace is connected to the first end of the eighth solenoid trace by the fifth via,
      the second end of the sixth solenoid trace is connected to the second end of the eighth solenoid trace by the sixth via,
      the at least one signal trace extends between the first and second vias and between the fourth and fifth vias in a direction substantially parallel to an axis extending in the plane of the at least one middle layer from the first via to the third via, and
      the first and second solenoids are connected in series.

2. The printed circuit board recited in claim 1, wherein:
   the first layer further includes a ninth solenoid trace having a first end and a second end, wherein the ninth solenoid trace is oriented substantially parallel to the first and second solenoid traces in the plane of the first layer;
   the at least one middle layer further comprises a seventh via and an eighth via, each of the seventh and eighth vias extending through the at least one middle layer in the direction substantially perpendicular to the plane of the second layer; and
   the second layer further includes a tenth solenoid trace having a first end and a second end, wherein the tenth solenoid trace is oriented substantially parallel to the third and fourth solenoid traces in the plane of the second layer,
   wherein:
      the first end of the fourth solenoid trace is connected to the first end of the ninth solenoid trace by the seventh via, and
      the second end of the ninth solenoid trace is connected to the second end of the tenth solenoid trace by the eighth via.

3. The printed circuit board recited in claim 1, wherein the at least one middle layer comprises a plurality of layers, and wherein each of the plurality of vias extends through each of the plurality of layers.

4. The printed circuit board recited in claim 1, wherein the at least one signal trace comprises at least two signal traces.

5. The printed circuit board recited in claim 1, wherein the at least one signal trace is a single-ended trace.

6. The printed circuit board recited in claim 1, wherein the at least one signal trace is configured to provide power to at least a portion of the printed circuit board.

7. The printed circuit board recited in claim 1, wherein:
   the first layer comprises at least eight solenoid traces, including the first and second solenoid traces,
   the second layer comprises at least eight solenoid traces, including the third and fourth solenoid traces, and
   the plurality of vias includes at least sixteen vias, including the first, second, and third vias.

8. A data storage device comprising the printed circuit board recited in claim 1.

9. A printed circuit board, comprising:
   at least three layers;
   a first solenoid embedded within the at least three layers;
   a second solenoid embedded within the at least three layers; and
   at least one trace extending through the first solenoid and the second solenoid,
wherein:
   a wind direction of the second solenoid is opposite a wind direction of the first solenoid.

10. The printed circuit board recited in claim 9, wherein the at least one trace is configured to carry a single-ended signal.

11. The printed circuit board recited in claim 10, wherein the single-ended signal is a power signal.

12. The printed circuit board recited in claim 9, wherein the at least three layers include a first layer, a second layer, and at least one middle layer, and wherein the first solenoid comprises:
   a first plurality of solenoid traces on the first layer, all of the first plurality of solenoid traces oriented substantially parallel to each other;
   a second plurality of solenoid traces on the second layer, all of the second plurality of solenoid traces oriented substantially parallel to each other; and
   a plurality of vias extending perpendicularly through the at least one middle layer, the plurality of vias coupling the first plurality of solenoid traces to the second plurality of solenoid traces.

13. The printed circuit board recited in claim 12, wherein the plurality of vias is a first plurality of vias, and wherein the second solenoid comprises:
   a third plurality of solenoid traces on the first layer, all of the third plurality of solenoid traces oriented substantially parallel to each other;
   a fourth plurality of solenoid traces on the second layer, all of the fourth plurality of solenoid traces oriented substantially parallel to each other; and
   a second plurality of vias extending perpendicularly through the at least one middle layer, the second plurality of vias coupling the third plurality of solenoid traces to the fourth plurality of solenoid traces.

14. A data storage device comprising the printed circuit board recited in claim 9.

* * * * *